United States Patent
Kim et al.

(10) Patent No.: US 9,299,446 B2
(45) Date of Patent: Mar. 29, 2016

(54) NONVOLATILE MEMORY DEVICE AND AN ERASE METHOD THEREOF

(71) Applicant: SAMSUNG ELECTRONICS CO., LTD., Suwon-si, Gyonggi-do (KR)

(72) Inventors: Ju-hyung Kim, Youngin-si (KR); Chang-seok Kang, Seongnam-si (KR); Young-suk Kim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/303,741

(22) Filed: Jun. 13, 2014

(65) Prior Publication Data

US 2015/0003170 A1 Jan. 1, 2015

(30) Foreign Application Priority Data

Jun. 28, 2013 (KR) .................. 10-2013-0075938

(51) Int. Cl.
*G11C 16/14* (2006.01)
*G11C 16/04* (2006.01)

(52) U.S. Cl.
CPC ............ *G11C 16/14* (2013.01); *G11C 16/0483* (2013.01); *G11C 2216/18* (2013.01)

(58) Field of Classification Search
CPC . G11C 16/14; G11C 2216/18; G11C 16/0483
See application file for complete search history.

(56) References Cited

U.S. PATENT DOCUMENTS

| 8,076,198 | B2 | 12/2011 | Lee et al. | |
|---|---|---|---|---|
| 8,120,089 | B2 | 2/2012 | Kim et al. | |
| 8,873,294 | B2 * | 10/2014 | Shim et al. | 365/185.18 |
| 2010/0320528 | A1 | 12/2010 | Jeong et al. | |
| 2011/0045657 | A1 | 2/2011 | Kim et al. | |
| 2011/0090737 | A1 | 4/2011 | Yoo et al. | |
| 2011/0096609 | A1 | 4/2011 | Lee et al. | |
| 2011/0194357 | A1 * | 8/2011 | Han et al. | 365/185.29 |
| 2011/0199825 | A1 | 8/2011 | Han et al. | |
| 2011/0216603 | A1 * | 9/2011 | Han et al. | 365/185.23 |
| 2011/0298013 | A1 | 12/2011 | Hwang et al. | |
| 2012/0120740 | A1 * | 5/2012 | Shim et al. | 365/189.14 |
| 2012/0134210 | A1 | 5/2012 | Maeda | |
| 2012/0146118 | A1 | 6/2012 | Lee et al. | |
| 2012/0182802 | A1 | 7/2012 | Hung et al. | |
| 2012/0206979 | A1 | 8/2012 | Shin et al. | |
| 2012/0275234 | A1 * | 11/2012 | Lee et al. | 365/185.23 |
| 2013/0182502 | A1 * | 7/2013 | Cheo et al. | 365/185.2 |

* cited by examiner

*Primary Examiner* — Vanthu Nguyen
(74) *Attorney, Agent, or Firm* — F. Chau & Associates, LLC (57) ABSTRACT

A nonvolatile memory device includes: a plurality of cell strings disposed on a substrate, wherein at least one of the plurality of cell strings comprises a plurality of cell transistors and at least one ground select transistor stacked in a direction substantially perpendicular to the substrate, and the substrate and a channel region of the plurality of cell strings have a same conductivity type; a substrate bias circuit configured to provide an erase voltage to the substrate in an erase operation; and a ground select line voltage generator configured to provide a ground select line saturation voltage to the at least one ground select transistor in the erase operation.

7 Claims, 8 Drawing Sheets

NONVOLATILE MEMORY DEVICE AND AN ERASE METHOD THEREOF

CROSS-REFERENCE TO RELATED APPLICATION

This application claims priority under 35 U.S.C. §119 to Korean Patent Application No. 10-2013-0075938, filed on Jun. 28, 2013, in the Korean Intellectual Property Office, the disclosure of which is incorporated by reference herein in its entirety.

TECHNICAL FIELD

The inventive concept relates to a nonvolatile memory device and an erase method thereof, and more particularly, to a nonvolatile memory device having a three-dimensional (3D) array structure and an erase method thereof.

DISCUSSION OF THE RELATED ART

Nonvolatile memory devices can retain data stored therein, even when not powered. Nonvolatile memory devices having a 3D array structure have been developed to increase the integration level of nonvolatile memory devices. However, the reliability of nonvolatile memory devices having a 3D array structure is degraded when program/erase operations are repeatedly performed.

SUMMARY

An exemplary embodiment of the inventive concept provides an erase method of a nonvolatile memory device having improved reliability.

An exemplary embodiment of the inventive concept provides a nonvolatile memory device having improved reliability.

According to an exemplary embodiment of the inventive concept, there is provided a nonvolatile memory device including: a plurality of cell strings disposed on a substrate, wherein at least one of the plurality of cell strings includes a plurality of cell transistors and at least one ground select transistor stacked in a direction substantially perpendicular to the substrate, and the substrate and a channel region of the plurality of cell strings have a same conductivity type; a substrate bias circuit configured to provide an erase voltage to the substrate in an erase operation; and a ground select line voltage generator configured to provide a ground select line saturation voltage to the at least one ground select transistor in the erase operation.

In exemplary embodiments of the inventive concept, the ground select line saturation voltage may be lower than the erase voltage.

In exemplary embodiments of the inventive concept, the at least one ground select transistor is not soft-erased by application of the ground select line saturation voltage.

In exemplary embodiments of the inventive concept, the ground select line voltage generator may be configured to: maintain a ground select line in a ground state in a first delay period; increase the ground select line voltage to the ground select line saturation voltage in a ground select line voltage increase period; maintain the ground select line saturation voltage in a ground select line voltage maintenance period; and decrease the ground select line voltage in a reset period.

In exemplary embodiments of the inventive concept, the substrate bias circuit may be configured to: increase a substrate voltage to the erase voltage in a substrate voltage increase period; maintain the erase voltage in a substrate voltage maintenance period; and decrease the substrate voltage in the reset period.

In exemplary embodiments of the inventive concept, an increase rate of the ground select line voltage may be higher than an increase rate of the substrate voltage.

In exemplary embodiments of the inventive concept, the ground select line voltage maintenance period may be reached when the substrate voltage maintenance period is reached.

In exemplary embodiments of the inventive concept, the ground select line voltage increase period may overlap the substrate voltage maintenance period.

In exemplary embodiments of the inventive concept, the ground select line voltage maintenance period may be reached after the substrate voltage maintenance period is reached.

According to an exemplary of the inventive concept, there is provided an erase method of a nonvolatile memory device, including: applying a ground voltage to a ground select line connected to at least one ground select transistor of a cell string including a plurality of cell transistors; applying a word line erase voltage to word lines connected to the plurality of cell transistors; applying an erase voltage to a substrate on which the cell string is disposed; and applying a ground select line saturation voltage to the ground select line, wherein the ground select line saturation voltage is applied to the ground select line after a first delay time ends after the erase voltage is applied to the substrate.

In exemplary embodiments of the inventive concept, the first delay time ends after a voltage of the substrate reaches a target voltage lower than the erase voltage.

In exemplary embodiments of the inventive concept, a voltage increase slope of the ground select line saturation voltage may be higher than a voltage increase slope of a voltage of the substrate.

In exemplary embodiments of the inventive concept, a voltage increase slope of the ground select line saturation voltage may be substantially equal to a voltage increase slope of a voltage of the substrate and the voltage increase slope of the ground select line saturation voltage is maintained for a predetermined period after the voltage of the substrate reaches the erase voltage.

In exemplary embodiments of the inventive concept, the at least one ground select transistor is not soft-erased by application of the ground select line saturation voltage.

In exemplary embodiments of the inventive concept, a soft erase voltage may be a difference between the erase voltage and a voltage reached by the ground select line when the ground select line is floated after the first delay time ends after the erase voltage is applied to the substrate, and a difference between the ground select line saturation voltage and the erase voltage may be smaller than the soft erase voltage.

According to an exemplary embodiment of the inventive concept, there is provided a nonvolatile memory device including a memory cell array including a plurality of cell strings disposed on a substrate, wherein at least one of the cell strings includes a plurality of memory cells and a ground select transistor stacked on the substrate; and a ground select line voltage generator configured to receive a ground enable signal and, in response to the ground enable signal, apply a ground select line saturation voltage to the ground select transistor after a delay time ends, the delay time occurring at the beginning of an erase operation.

The nonvolatile memory device may further include a substrate monitor circuit configured to generate the ground enable signal.

The ground enable signal may be transmitted to the ground select line voltage generator when a voltage of the substrate reaches a target voltage lower than an erase voltage.

The ground select line saturation voltage may continue to increase when an erase voltage has stopped increasing.

An increase rate of the ground select line saturation voltage may be greater than an increase rate of an erase voltage.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Hereinafter, exemplary embodiments of the inventive concept will be described in detail with reference to the accompanying drawings.

The inventive concept may, however, be embodied in many different forms and should not be construed as being limited to the embodiments set forth herein. In the drawings, the thicknesses or sizes of layers may be exaggerated for the convenience of description and clarity.

Figure 1:
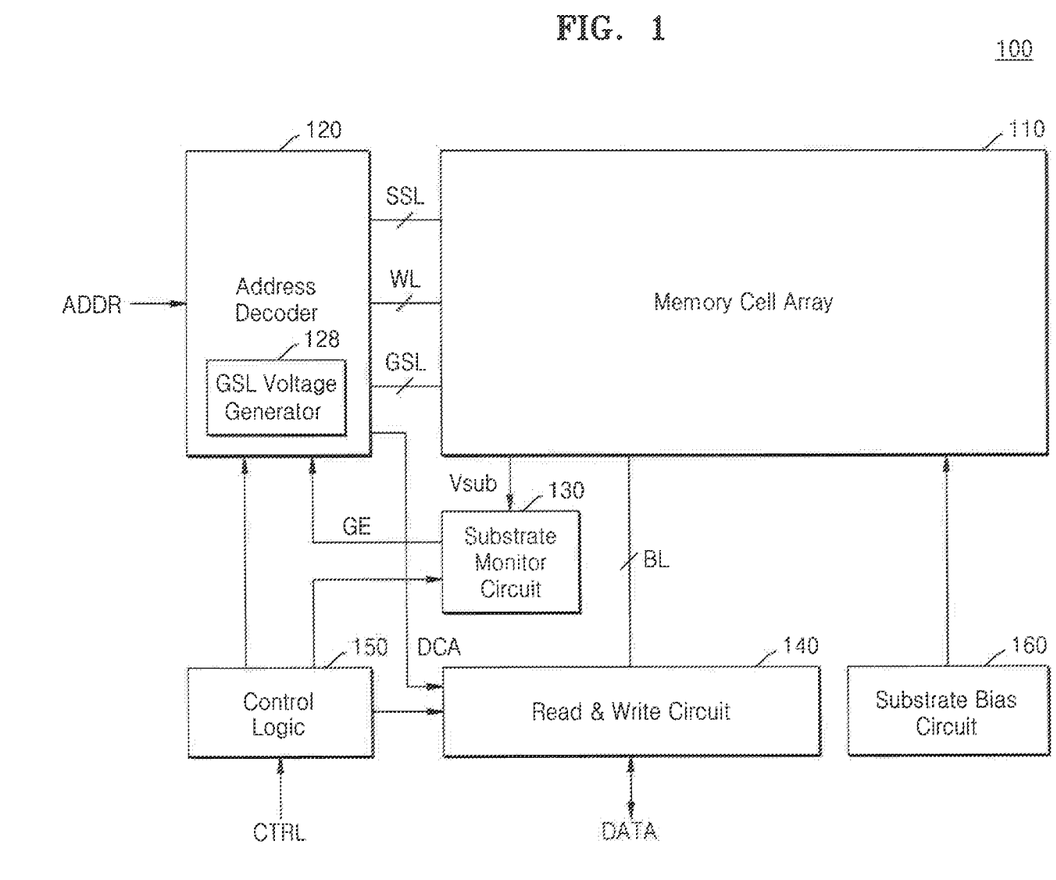
FIG. 1 is a block diagram illustrating a nonvolatile memory device according to an exemplary embodiment of the inventive concept.

FIG. 1 is a block diagram illustrating a nonvolatile memory device 100 according to an exemplary embodiment of the inventive concept.

Referring to FIG. 1, the nonvolatile memory device 100 includes a memory cell array 110, an address decoder 120, a substrate monitor circuit 130, a read/write circuit 140, control logic 150, and a substrate bias circuit 160.

The memory cell array 110 is connected to the address decoder 120 through word lines WL and select lines including string select lines SSL and ground select lines GSL. The memory cell array 110 is connected to the read/write circuit 140 through bit lines BL. In addition, the memory cell array 110 is connected to the substrate monitor circuit 130 and the substrate bias circuit 160.

The memory cell array 110 includes a plurality of memory cell strings. Each of the memory cell strings may be connected to a memory block such that the memory cell array 110 includes a plurality of memory blocks. Each of the memory cell strings includes a plurality of memory cells and a plurality of select transistors. For example, each of the memory cell strings may include at least one string select transistor and at least one ground select transistor. As an example, the memory cell array 110 is configured to store one or more bits in each cell.

The address decoder 120 is configured to receive an address ADDR from the outside and operate in response to the control of the control logic 150. The address decoder 120 is connected to the memory cell array 110 through the word lines WL, the string select lines SSL, and the ground select lines GSL.

The address decoder 120 is configured to decode a row address and a column address among the received address ADDR. By using the decoded row address, the address decoder 120 selects a corresponding memory block of the memory cell array 110 and selects the ground select line GSL, the string select lines SSL, and the word lines WL of the selected memory block. A decoded column address DCA is provided from the address decoder 120 to the read/write circuit 140.

The address decoder 120 is configured to receive a ground enable signal GE from the substrate monitor circuit 130. The address decoder 120 is configured to control an output voltage in response to the received ground enable signal GE. For example, the address decoder 120 may be configured to operate in response to the ground enable signal GE in an erase operation. In exemplary embodiments of the inventive concept, the address decoder 120 may include a ground select line (GSL) voltage generator 128. The GSL voltage generator 128 may receive the ground enable signal GE and bias the ground select line GSL.

The substrate monitor circuit 130 is connected to the memory cell array 110 and the address decoder 120. The substrate monitor circuit 130 is configured to operate in response to the control of the control logic 150. The substrate monitor circuit 130 is configured to monitor a substrate voltage $V_{sub}$ of the memory cell array 110. The substrate monitor circuit 130 is configured to activate/deactivate the ground enable signal GE based on a level of the substrate voltage $V_{sub}$ of the memory cell array 110. The ground enable signal GE is transmitted to the address decoder 120 from the substrate monitor circuit 130. For example, in an erase operation, when the ground enable signal GE is transmitted from the substrate monitor circuit 130 to the GSL voltage generator 128 based on the level of the substrate voltage $V_{sub}$, a voltage may be applied from the GSL voltage generator 128 to the ground select line GSL.

The read/write circuit 140 is connected to the memory cell array 110 through the bit lines BL. The read/write circuit 140 is configured to operate in response to the control of the control logic 150 and receive the decoded column address DCA from the address decoder 120. The read/write circuit 140 selects the bit lines BL by using the decoded column address DCA. The read/write circuit 140 transmits/receives DATA to/from the outside.

The read/write circuit 140 may include elements such as a page buffer (or page register), a row selection circuit, a sense amplifier, a write driver, and a column selection circuit.

The control logic 150 is connected to the address decoder 120, the substrate monitor circuit 130, and the read/write circuit 140. In addition, the control logic 150 may be connected to the substrate bias circuit 160. The control logic 150 is configured to operate in response to a control signal CTRL received from the outside and control various operations of the nonvolatile memory device 100.

The substrate bias circuit 160 operates in response to the control of the control logic 150. The substrate bias circuit 160 is configured to bias a substrate of the memory cell array 110. For example, the substrate bias circuit 160 may be configured to apply an erase voltage to the substrate of the memory cell array 110 in an erase operation.

The substrate monitor circuit 130 may be omitted. In this case, the address decoder 120 may drive the GSL voltage generator 128 after waiting a predetermined delay time after applying an erase voltage to the substrate of the memory cell array 110 in an erase operation.

Figure 2:
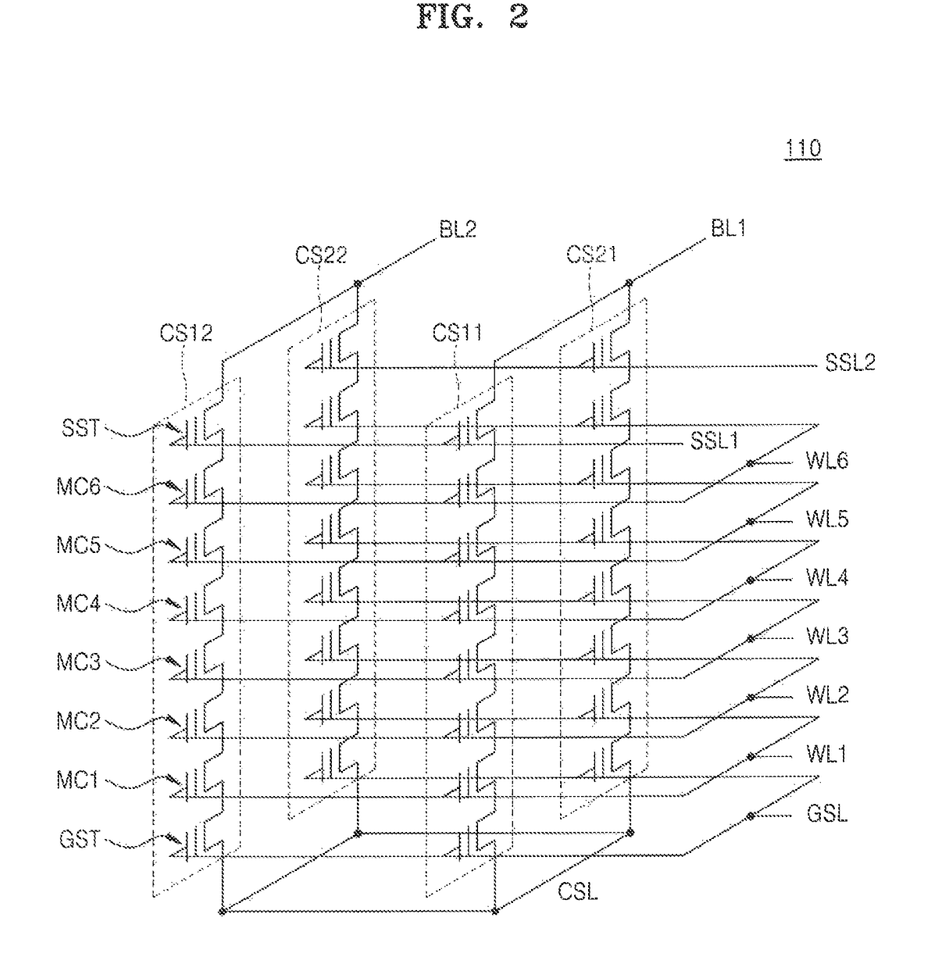
FIG. 2 is an equivalent circuit diagram illustrating a memory cell array of FIG. 1, according to an exemplary embodiment of the inventive concept.

FIG. 2 is an equivalent circuit diagram illustrating the memory cell array 110 of FIG. 1, according to an exemplary embodiment of the inventive concept.

Referring to FIG. 2, the memory cell array 110 has a three-dimensional (3D) structure. The memory cell array 110 may include a plurality of cell strings CS11, CS12, CS21 and CS22 extending in a vertical direction. Each of the cell strings CS11, CS12, CS21 and CS22 may include a ground select transistor GST, a plurality of memory cell transistors MC1, MC2, . . . , MC6, and a string select transistor SST that are connected in series. Although FIG. 2 illustrates that each of the cell strings CS11, CS12, CS21 and CS22 includes one ground select transistor GST and one string select transistor SST, each of the cell strings CS11, CS12, CS21 and CS22 may include two or more ground select transistors GST and/ or two or more string select transistors SST connected in series. In addition, the number of memory cell transistors MC1, MC2, . . . , MC6 is not limited thereto.

The cell strings CS11, CS12, CS21 and CS22 may be connected in units of rows and columns. The respective string select transistors SST of the cell strings CS11, CS12, CS21 and CS22 are connected to corresponding bit lines BL1 and BL2. For example, the cell strings CS11 and CS21 connected in common to the first bit line BL1 form a first column, and the cell strings CS12 and CS22 connected in common to the second bit line BL2 form a second column. In addition, the respective string select transistors SST of the cell strings CS11, CS12, CS21 and CS22 may be connected to corresponding string select lines SSL1 and SSL2. For example, the cell strings CS11 and CS12 connected in common to the first string select line SSL1 form a first row, and the cell strings CS21 and CS22 connected in common to the second string select line SSL2 form a second row.

The respective ground select transistors GST of the cell strings CS11, CS12, CS21 and CS22 are connected by a ground select line GSL. A common source line CSL is connected to the respective ground select transistors GST of the cell strings CS11, CS12, CS21 and CS22.

The memory cell transistors MC1, MC2, . . . , MC6 are connected to the word lines WL1, WL1, . . . , WL6, respectively. The memory cell transistors located at the same height of the cell strings CS11, CS12, CS21 and CS22 are connected to the same word line. For example, the first memory cell transistor MC1 connected to the ground select transistor GST may be connected through the first word line WL1 to the first memory cell transistor MC1 of an adjacent column.

Figure 3:
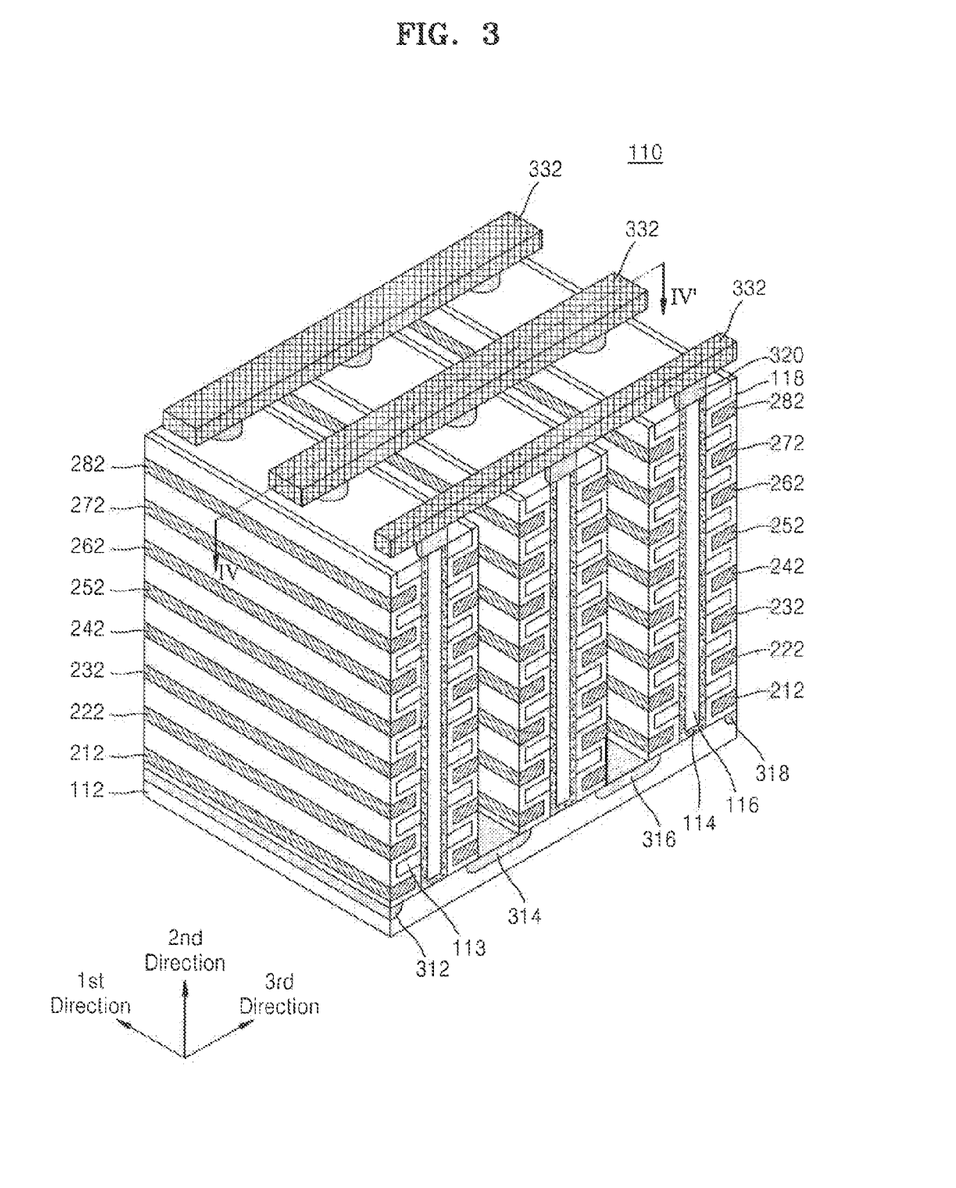
FIG. 3 is a perspective view of the memory cell array of FIG. 1, according to an exemplary embodiment of the inventive concept.

FIG. 3 is a perspective view of the memory cell array 110 of FIG. 1, according to an exemplary embodiment of the inventive concept.

First, a substrate 112 is provided. Examples of the substrate 112 may include a silicon substrate, a germanium substrate, a silicon-germanium substrate, and a silicon-on-insulator (SOD substrate. In exemplary embodiments of the inventive concept, the substrate 112 may be a well having a first conductivity type. For example, the substrate 112 may be a p-well formed by implantation of Group III elements such as boron (B). In addition, the substrate 112 may be a pocket p-well provided in an n-well.

First to fourth doped regions 312, 314, 316 and 318 extending in a first direction are provided on the substrate 112. In exemplary embodiments of the inventive concept, the first, second, third and fourth doped regions 312, 314, 316 and 318 may have a second conductivity type different from the first conductivity type of the substrate 112. For example, the first, second, third and fourth doped regions 312, 314, 316 and 318 may have an n-conductivity type.

On a region of the substrate 112 between the first and second doped regions 312 and 314, a plurality of insulating materials 113 extend in the first direction parallel to a main surface of the substrate 112 and are spaced apart from each other in a second direction substantially perpendicular to the main surface of the substrate 112. As an example, the insulating materials 113 may include an insulating material, such as silicon oxide, silicon oxynitride, or silicon nitride.

On a region of the substrate 112 between the first and second doped regions 312 and 314, a plurality of channel regions 114 are disposed sequentially in the first direction and penetrate the insulating materials 113 in the second direction. In exemplary embodiments of the inventive concept, the channel regions 114 may have a pillar shape that contacts the substrate 112 and extends in the second direction. For example, the channel regions 114 may include silicon having the first conductivity type, intrinsic silicon, or silicon having the second conductivity type. In exemplary embodiments of the inventive concept, the channel regions 114 may have a cylindrical shape with a bottom portion contacting the substrate 112, and a buried insulating layer 116 may be further formed inside the channel regions 114. FIG. 3 illustrates a case where the buried insulating layer 116 is formed inside the channel regions 114. The buried insulating layer 116 may include an insulating material such as silicon oxide, and may include an air gap.

In a region between the first and second doped regions 312 and 314, a gate insulating film 118 is provided along the exposed surface of the substrate 112, the channel regions 114, and the insulating materials 113. The gate insulating film 118 is formed to conformally cover the insulating materials 113, which are spaced apart from each other in the second direction, and the sidewall of the channel region 114 that is not covered by the insulating materials 113. A portion of the gate insulating film 118, which covers top portions of the first and second doped regions 312 and 314, may be removed to expose the top portions of the first and second doped regions 312 and 314. In addition, the gate insulating film 118, which is provided on an upper surface of the uppermost insulating material 113 (among the insulating materials 113 stacked in the second direction), may be removed to expose the upper surface of the uppermost insulating material 113.

The gate insulating film 118 may include a tunnel insulating layer, a charge storage layer, and a blocking insulating layer that are sequentially stacked. In exemplary embodiments of the inventive concept, the tunnel insulating layer may include silicon oxide, and the charge storage layer may be a charge trapping layer or a floating gate layer. The charge storage layer may include a quantum dot or a nanocrystal, and the quantum dot or the nanocrystal may include a conductor, for example, metal or semiconductor nanoparticles. The blocking insulating layer may include a metal oxide of a high-k dielectric material having a high dielectric constant.

In a region between the first and second doped regions 312 and 314, first conductive materials 212 to 282 are formed on the exposed surface of the gate insulating film 118. For example, the first conductive material 212 extending in the first direction is formed between the substrate 112 and the gate insulating film 118 formed on the bottom surface of the insulating material 113 that is most adjacent to the substrate 112. In addition, since the insulating materials 113 are spaced apart from each other in the second direction, the first conductive materials 222 to 282 may be formed in respective spaces between the insulating materials 113. Therefore, the first conductive materials 212 to 282 may be formed to be spaced apart from each other in the second direction and extend in the first direction as illustrated in FIG. 3. The gate insulating film 118 is interposed between the insulating materials 113 and the first conductive materials 212 to 282.

As an example, the first conductive materials 212 to 282 may include metal materials, such as tungsten, copper, aluminum, titanium, tantalum, and ruthenium, or conductive materials such as polysilicon. A diffusion barrier layer may be further formed between the first conductive materials 212 to 282 and the gate insulating film 118. The diffusion barrier layer may include tungsten nitride, tantalum nitride, or titanium nitride.

A structure substantially identical to the structure on the first and second doped regions 312 and 314 may be formed in a region between the second and third doped regions 314 and 316. In addition, a structure substantially identical to the structure on the first and second doped regions 312 and 314 may be formed in a region between the third and fourth doped regions 316 and 318.

Drains 320 are formed on the channel regions 114, respectively. As an example, the drains 320 may be silicon materials doped with the second conductivity type. For example, the drains 320 may include n-conductivity type silicon including n-type dopants such as arsenic.

Second conductive materials 332 are formed on the drains 320. The second conductive materials 332 are parallel to the main surface of the substrate 112 and extend in a third direction different from the first direction. The second conductive materials 332 are disposed sequentially in the first direction. The second conductive materials 332 are connected to the corresponding drains 320, respectively. As an example, the drains 320 and the second conductive materials 332 may be connected through contact plugs, respectively. In exemplary embodiments of the inventive concept, the second conductive materials 332 may include conductive materials such as metal and doped polysilicon.

Referring to FIGS. 2 and 3, each of the channel regions 114, together with the adjacent gate insulating film 118 and the first conductive materials 212 to 282 may constitute the cell strings CS11 to CS22. For example, the gate insulating film 118 formed between the channel region 114 and the first conductive materials 212 to 282 may have a stack of a plurality of layers that act as a tunnel insulating layer, a charge storage layer, and a blocking insulating layer. Portions along the sidewall of the channel region 114, in which the gate insulating film 118 and the first conductive materials 212 to 282 are sequentially staked, may constitute respective transistors.

The first conductive material 212 formed at the lowermost portion in the second direction along the sidewall of the channel region 114 may function as a gate electrode, and may correspond to the ground select line GSL. Accordingly, the channel region 114, the first conductive material 212, and the gate insulating film 118 interposed therebetween may act as the ground select transistor GST.

In addition, the first conductive materials 222 to 272, which are sequentially formed on the first conductive material 212 along the sidewall of the channel region 114 to be spaced apart from each other in the second direction, may correspond to the word lines WL1 to WL6. The channel region 114, the first conductive materials 222 to 272, and the gate insulating film 118 interposed therebetween may correspond to the memory cell transistors MC1 to MC6.

The first conductive material 282 formed at the uppermost portion in the second direction along the sidewall of the channel region 114 may correspond to the string select lines SSL1 and SSL2. The channel region 114, the first conductive material 282, and the gate insulating film 118 interposed therebetween may correspond to the string select transistor SST.

The second conductive materials 332, which are connected to the drains 320 and extend in the third direction, may correspond to the bit lines BL. Accordingly, the bit lines BL may be connected to the cell strings CS11 to CS22.

The first, second, third and fourth doped regions 312, 314, 316 and 318 extending in the first direction may correspond to the common source line CSL.

The memory cell array 110 illustrated in FIGS. 2 and 3 is merely exemplary, and the number of word lines, the number of string select lines, and the number of ground select lines are not limited thereto. For example, in the memory cell array 110, two or more string select lines may be provided sequentially in the second direction, or two or more ground select lines may be provided sequentially in the second direction. In addition, the number of word lines may be various, such as 8, 16, and 32. In addition, the number of cell strings connected to the bit line BL is not limited to the number of cell strings illustrated in FIGS. 2 and 3, and may vary according to the design of the memory cell array 110. In addition, the structure of the memory cell array 110 illustrated in FIGS. 2 and 3 is merely exemplary, and the memory cell array 110 is not limited to the embodiments described herein and may include various types of memory cell arrays having a 3D array structure.

Figure 4:
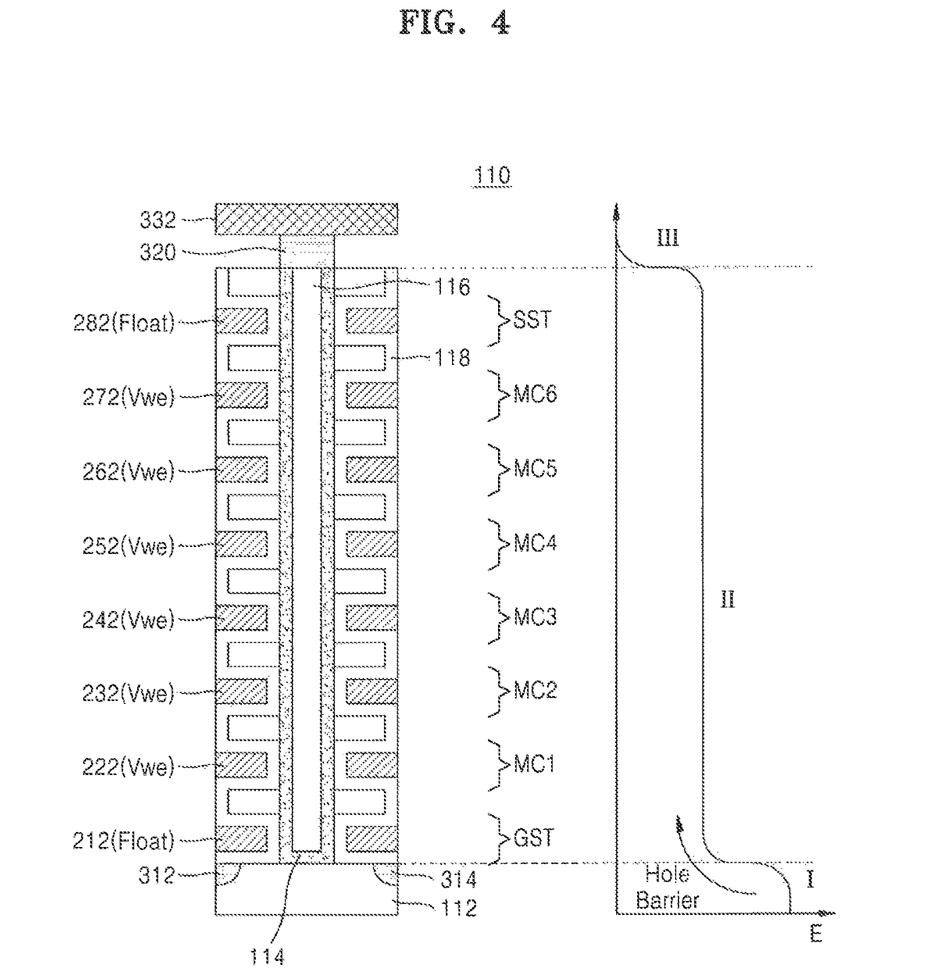
FIG. 4 is a cross-sectional view illustrating a cell string of the memory cell array of FIG. 3 and a band diagram of the cell string in an erase operation, according to an exemplary embodiment of the inventive concept.

FIG. 4 is a cross-sectional view illustrating a cell string of the memory cell array 110 of FIG. 3 and a band diagram of the cell string in an erase operation, according to an exemplary embodiment of the inventive concept. FIG. 4 illustrates a cross-sectional view taken along line IV-IV' of FIG. 3 and an energy level E of a valence band depending on height.

Referring to FIG. 4, a substrate I (112) may be a p-conductivity type silicon layer. A channel region II (114) may be a p-conductivity type silicon layer, for example, a silicon layer that has a lower doping concentration than the substrate I. Therefore, the channel region II may have a lower energy band than the substrate I. For example, the channel region II may have an energy band that is lower by about 0.4 eV to about 0.5 eV than the energy band of the substrate I, and an energy band difference therebetween may vary according to the doping concentration of the channel region II. A drain III (320) may be an n-conductivity type silicon layer. Therefore, the drain III may have a lower energy band than the channel region II.

When an erase voltage $V_{ers}$ that is positive is supplied to the substrate I, an erase voltage is supplied to the channel region II along holes. Since a hole barrier due to an energy barrier is generated between the substrate I and the channel region II, a voltage may not be easily transmitted by holes. Therefore, a voltage lower than the erase voltage $V_{ers}$ may be applied to the channel region II, and thus an erase operation of the memory cells MC1 to MC6 may not be normally performed.

When the erase operation is performed, only the memory cells MC1 to MC6 should be erased, not the ground select transistor GST. For example, if the erase voltage $V_{ers}$ is applied to the ground select transistor GST to erase the ground select transistor GST, the threshold voltage of the ground select transistor GST is changed, and the reliability of the memory cell array 110 may be degraded. Thus, the erase voltage $V_{ers}$ is applied to the substrate I, and the ground select transistor GST is floated to prevent the erase voltage $V_{ers}$ from being applied to the ground select transistor GST.

When the ground select transistor GST is floated, a voltage equal to the voltage applied to the substrate I is applied to the ground select transistor GST. Therefore, when the potential of the substrate I increases, the potential of the ground select transistor GST also increases. Thus, the erase voltage $V_{ers}$ may not be easily supplied to the channel region II, and the erase operation of the memory cells MC1 to MC6 may not be normally performed.

Figure 5:
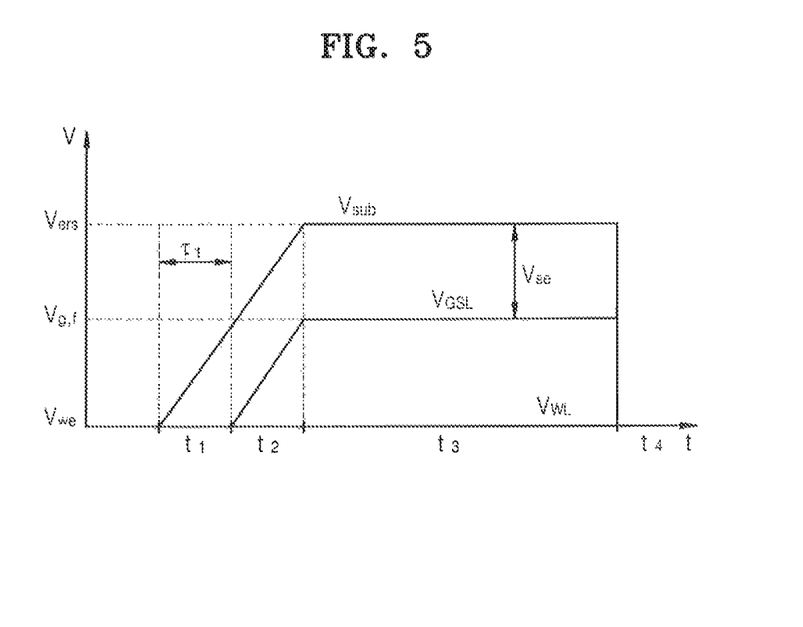
FIG. 5 is a timing diagram illustrating an erase method according to a comparative example.

FIG. 5 is a timing diagram illustrating an erase method according to a comparative example.

Referring to FIG. 5, a method for erasing memory cells in the above-described structure will be described below. In FIG. 5, a voltage applied to the substrate 112 of FIG. 4, a voltage applied to the word lines WL1 to WL6 of FIG. 2, and a voltage applied to the ground select line GSL of FIG. 2 are represented as $V_{sub}$, $V_{WL}$, and $V_{GSL}$, respectively.

In a period $t_1$, a voltage is applied to the substrate 112 at a predetermined slope, and the ground select line GSL is grounded. A word line erase voltage $V_{we}$ is applied to the word lines WL1 to WL6, and the word line erase voltage $V_{we}$ may be, for example, a ground voltage. In this period, since the ground select line GSL is maintained at a predetermined voltage when a voltage of the substrate 112 increases, holes may be accumulated between the channel region 114 of FIG. 4 and the substrate 112, and thus an energy barrier may be reduced. Since a voltage increase of the ground select line GSL is delayed in the period $t_1$, this period is defined as a first delay time $\tau_1$.

In a period $t_2$, the voltage of the substrate 112 continuously increases until reaching the erase voltage $V_{ers}$. The ground select line GSL may be floated from a start time point of the period $t_2$. Therefore, the voltage of the ground select line GSL also increases due to a coupling with the voltage of the substrate 112 according to the voltage increase of the substrate 112. In this period, the substrate 112 and the ground select line GSL may be maintained at a predetermined voltage difference.

In a period $t_3$, the voltage of the substrate 112 is maintained at the erase voltage $V_{ers}$, and the voltage of the ground select line GSL is maintained. In this case, the ground select line GSL is also floated, and the voltage of the ground select line GSL may also maintain a predetermined difference with respect to the voltage of the substrate 112. The voltage reached by the ground select line GSL may be defined as a GSL floating voltage $V_{g,f}$. In other words, the ground select line GSL is floated after a lapse of the first delay time $\tau_1$ after the erase voltage $V_{ers}$ applied to the substrate 112, and the voltage reached by the ground select line GSL is referred to as the GSL floating voltage $V_{g,f}$. In the period $t_3$, Fowler-Nordheim tunneling may be generated at the memory cells MC1 to MC6 of FIG. 4 by the voltage difference between the channel region 114 and the word lines WL1 to WL6, and the memory cells MC1 to MC6 may be normally erased.

In a period $t_4$, the voltages of the substrate 112 and the ground select line GSL decrease.

In the above-described method, the first delay time $\tau_1$ of the ground select line GSL may be about 0.01 ms to about 1 ms. For example, since the erase voltage $V_{ers}$ of the substrate 112 may not be sufficiently supplied to the channel region 114 when the first delay time $\tau_1$ is too short, the first delay time $\tau_1$ may be about 0.01 ms to about 1 ms. The voltage difference between the ground select line GSL and the substrate 112 increases as the first delay time $\tau_1$ of the ground select line GSL increases, in other words, as the ground select line GSL maintains the ground voltage over a longer period of time. When the substrate 112 maintains the erase voltage $V_{ers}$ and a difference between the erase voltage $V_{ers}$ and the GSL floating voltage $V_{g,f}$ is greater than a predetermined value, the ground select transistor GST of FIG. 4 may be soft-erased. Therefore, when a plurality of program/erase operations are performed repeatedly, since the threshold voltage of the ground select transistor GST is changed by the soft erase of the ground select transistor GST, the reliability of the non-volatile memory device 100 may be degraded. Herein, the difference between the GSL floating voltage $V_{g,f}$ and the erase voltage $V_{ers}$ is defined as a soft erase voltage $V_{se}$.

Figure 6:
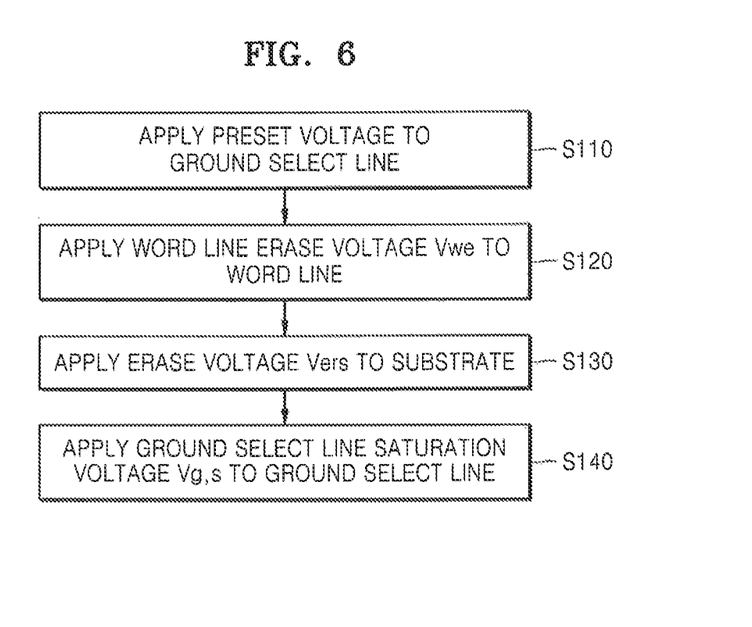
FIG. 6 is a flowchart illustrating an erase method of a nonvolatile memory device according to an exemplary embodiment of the inventive concept.

FIG. 6 is a flowchart illustrating an erase method according to an exemplary embodiment of the inventive concept.

Referring to FIG. 6, in operation S110, a first preset voltage is applied to the ground select line GSL of FIG. 2. In exemplary embodiments of the inventive concept, the first preset voltage may be lower than the threshold voltage of the ground select transistor GST of FIG. 2. For example, the first preset voltage may be the ground voltage. For example, the GSL voltage generator 128 of FIG. 1 may drive the ground select line GSL with the first preset voltage.

In operation S120, a word line erase voltage $V_{we}$ is applied to the word lines WL1 to WL6 of FIG. 2. In exemplary embodiments of the inventive concept, the word, line erase voltage $V_{we}$ may be equal to or lower than the ground voltage. For example, the address decoder 120 of FIG. 1 may drive the word lines WL1 to WL6 with the word line erase voltage $V_{we}$.

In operation S130, an erase voltage $V_{ers}$ is applied to the substrate 112 of FIG. 3. For example, the erase voltage $V_{ers}$ may be higher than the word line erase voltage $V_{we}$ and may be higher than the first preset voltage. For example, the substrate bias circuit 160 of FIG. 1 may provide the erase voltage $V_{ers}$ to the substrate 112.

In operation S140, a GSL saturation voltage $V_{g,s}$ is applied to the ground select line GSL. In exemplary embodiments of the inventive concept, the GSL saturation voltage $V_{g,s}$ may be provided corresponding to a voltage change of the substrate 112. In particular, when the voltage of the substrate 112 reaches a target voltage $V_{tar}$ (see FIG. 7) lower than the erase voltage $V_{ers}$, a ground enable signal GE may be transmitted from the substrate monitor circuit 130 of FIG. 1 to the GSL voltage generator 128. In response to the ground enable signal GE, the GSL voltage generator 128 may be turned on to apply the GSL saturation voltage $V_{g,s}$ to the ground select line GSL. In addition, after a lapse of the first delay time $\tau_1$ after the erase voltage $V_{ers}$ is applied to the substrate 112, the GSL voltage generator 128 may be turned on to apply the GSL saturation voltage $V_{g,s}$ to the ground select line GSL. A sequence of applying the GSL saturation voltage $V_{g,s}$ to the ground select line GSL will be described below in detail with reference to FIGS. 7 to 9.

The above-described operations S110 to S140 may be performed simultaneously or sequentially, and the order of operations S110 to S140 may vary.

Figure 7:
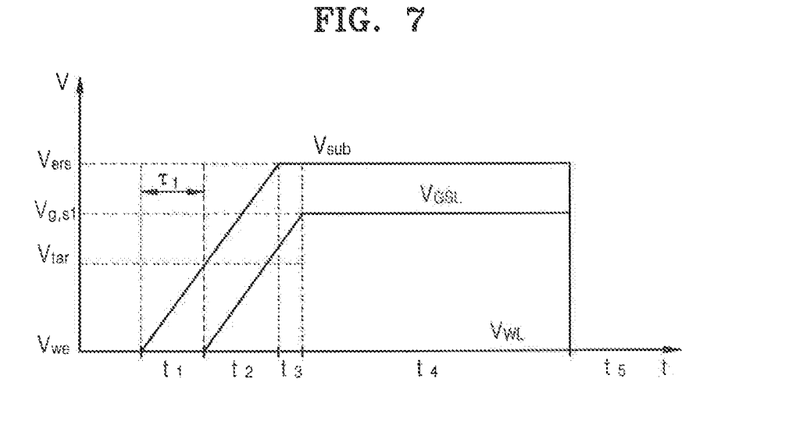
FIG. 7 is a timing diagram illustrating an erase method of a nonvolatile memory device according to an exemplary embodiment of the inventive concept.

FIG. 7 is a timing diagram illustrating an erase method according to an exemplary embodiment of the inventive concept. In FIG. 7, a voltage applied to the substrate 112 of FIG. 3, a voltage applied to the word lines WL1 to WL6 of FIG. 2, and a voltage applied to the ground select line GSL of FIG. 2 are represented as $V_{sub}$, $V_{WL}$, and $V_{GSL}$ respectively.

Referring to FIG. 7, in a first period $t_1$, the voltage of the substrate 112 increases at a predetermined slope until reaching a target voltage $V_{tar}$. Herein, the ground select line GSL may be maintained at a first preset voltage, and the first preset voltage may be the ground voltage. Since a voltage increase of the ground select line GSL is delayed in the period $t_1$, this period is defined as a first delay time $\tau_1$. In this period, the word lines WL1 to WL6 may be maintained at a word line erase voltage $V_{we}$, and the word line erase voltage $V_{we}$ may also be the ground voltage. In FIG. 7, the first preset voltage and the word line erase voltage $V_{we}$ are represented as the ground voltage. However, the first preset voltage and the word line erase voltage $V_{we}$ are not limited thereto and may have a predetermined level that is sufficiently lower than the erase voltage $V_{ers}$. At this time, the string select line SSL of FIG. 2 may be floated, and the voltage of the string select line SSL may also increase due to the coupling with the voltage of the substrate 112.

In a second period $t_2$, the voltage of the substrate 112 increases at the same slope as it did in the first period $t_1$ until reaching the erase voltage $V_{ers}$. In this period, the GSL voltage generator 128 of FIG. 1 is turned on, and the voltage of the ground select line GSL also increases at a predetermined slope. In other words, the GSL voltage generator 128 may be turned on at the time when the voltage of the substrate 112 reaches the target voltage $V_{tar}$ (the start time point of the second period $t_2$). In exemplary embodiments of the inventive concept, an increase rate of the voltage (in other words, a slope of a voltage profile) of the ground select line GSL may be equal to an increase rate of the voltage of the substrate 112; however, exemplary embodiments of the inventive concept are not limited thereto.

In a, third period $t_3$, the voltage of the substrate 112 is maintained at the erase voltage $V_{ers}$. The voltage of the ground select line GSL increases at the same slope as it did in the second period $t_2$ until reaching the GSL saturation voltage $V_{g,s1}$.

In a fourth period $t_4$, the voltage of the substrate 112 is maintained at the erase voltage $V_{ers}$, and the voltage of the ground select line GSL reaches the GSL saturation voltage $V_{g,s1}$ and is maintained at the GSL saturation voltage $V_{g,s1}$.

In this period, since the voltage of the substrate 112 is maintained at the erase voltage $V_{ers}$, a voltage substantially equal to the erase voltage $V_{ers}$ may be provided to the channel region 114 (see FIG. 4) coupled with the voltage of the substrate 112. Since the word lines WL1 to WL6 are maintained at the word line erase voltage $V_{we}$, Fowler-Nordheim tunneling may be generated at the memory cells MC1 to MC6 by the voltage difference between the channel region 114 and the word lines WL1 to WL6, and the memory cells MC1 to MC6 may be normally erased.

In addition, in this period, the ground select line GSL is maintained at the GSL saturation voltage $V_{g,s1}$. Therefore, the voltage difference between the ground select line GSL and the channel region 114 may be smaller than the erase voltage $V_{ers}$ such that the ground select transistors GST are not soft-erased.

In addition, in this period, the GSL saturation voltage $V_{g,s1}$ may be higher than the GSL floating voltage $V_{g,f}$ (see FIG. 5) that is the voltage reached by the ground select line GSL when the ground select line GSL is floated. In other words, the difference between the GSL saturation voltage $V_{g,s1}$ and the erase voltage $V_{ers}$ may be smaller than the soft erase voltage $V_{se}$ of FIG. 5. Accordingly, the soft erase of the ground select transistor GST may be prevented.

In a fifth period $t_5$, the voltages of the substrate 112 and the ground select line GSL decrease. As illustrated in FIG. 7, in the fifth period $t_5$, the voltage of the substrate 112 and the voltage of the ground select line GSL may be maintained at the ground voltage. The voltage of the substrate 112 and the voltage of the ground select line GSL may decrease at a predetermined slope and reach the ground voltage.

In the above-described erase method of FIG. 7, the periods $t_1$ and $t_2$ may be a substrate voltage increase period for increasing the voltage of the substrate 112 to the erase voltage $V_{ers}$; the periods $t_3$ and $t_4$ may be a substrate voltage maintenance period for maintaining the erase voltage $V_{ers}$ for a predetermined time; and the period $t_5$ may be a reset period for decreasing the voltage of the substrate 112. In addition, the period $t_1$ may be a first delay period for maintaining the ground state of the ground select line GSL; the periods $t_2$ and $t_3$ may be a GSL voltage increase period for increasing the GSL voltage to the GSL saturation voltage $V_{g,s1}$; the period $t_4$ may be a GSL voltage maintenance period for maintaining the GSL saturation voltage $V_{g,s1}$ for a predetermined time; and the period $t_5$ may be a reset period for decreasing the voltage of the ground select line GSL. In other words, in the period $t_3$, the GSL voltage increase period may overlap partially with the substrate voltage maintenance period. In addition, the GSL voltage generator 128 may cause the GSL voltage maintenance period to be reached after the substrate bias circuit 160 of FIG. 1 causes the substrate voltage maintenance period to be reached.

In the case of a memory block among the memory cell array 110, which does not perform an erase operation, the bit line BL of FIG. 2 and the string select line SSL of FIG. 2 maintain a floating state.

In the case of a memory block among the memory cell array 110, which does not perform an erase operation, since the memory block shares the bit line BL with the memory block performing an erase operation, the operations of the string select line SSL and the word lines WL are determined according to the operation of the bit line BL. As illustrated in Table 1 below, in the case of an unselected memory block, in other words, a memory block that does not perform an erase operation, all of the substrate 112, the ground select line GSL, the word line WL, the string select line SSL, and the bit line BL may be floated.

TABLE 1

| Selected Memory Block | | Unselected Memory Block | |
| --- | --- | --- | --- |
| BL | Float | BL | Float |
| SSL | Float | SSL | Float |
| WL | $V_{we}$ | WL | Float |
| GSL | $V_{g,s1}$ | GSL | Float |
| Substrate | $V_{ers}$ | Substrate | Float |

According to the above-described erase method of FIG. 7, since the delay period of the ground select line GSL is sufficiently maintained, the memory cells MC1 to MC6 may be normally erased. In addition, since the difference between the GSL saturation voltage $V_{g,s1}$ and the erase voltage $V_{ers}$ is smaller than the soft erase voltage $V_{se}$, the soft erase of the ground select transistor GST may be prevented.

Figure 8:
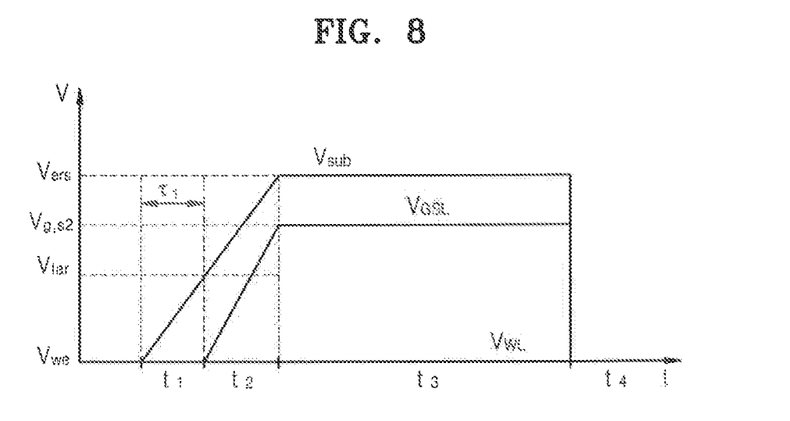
FIG. 8 is a timing diagram illustrating an erase method of a nonvolatile memory device according to an exemplary embodiment of the inventive concept.

FIG. 8 is a timing diagram illustrating an erase method according to an exemplary embodiment of the inventive concept. In FIG. 8, a voltage applied to the substrate 112 of FIG. 3, a voltage applied to the word lines WL1 to WL6 of FIG. 2, and a voltage applied to the ground select line GSL of FIG. 2 are represented as $V_{sub}$, $V_{WL}$, and $V_{GSL}$ respectively.

Referring to FIG. 8, in a first period $t_1$, the voltage of the substrate 112 increases at a predetermined slope until reaching a target voltage $V_{tar}$. Herein, the ground select line GSL may be maintained at a first preset voltage, and the first preset voltage may be the ground voltage.

In a second period $t_2$, the voltage of the substrate 112 increases at the same slope as it did in the first period $t_1$ until reaching the erase voltage $V_{ers}$. In this period, the GSL voltage generator 128 of FIG. 1 is turned on, and the voltage of the ground select line GSL increases at a predetermined slope until reaching a GSL saturation voltage $V_{g,s2}$. Herein, the voltage of the ground select line GSL increases at a greater slope than the voltage of the substrate 112.

In a third period $t_3$, the voltage of the substrate 112 is maintained at the erase voltage $N_{ers}$, and the voltage of the ground select line GSL is maintained at the GSL saturation voltage $V_{g,s2}$.

As described with reference to FIG. 5, in the second period $t_2$, when the ground select line GSL is floated after a lapse of the first delay time $\tau_1$ after the erase voltage $V_{ers}$ is applied to the substrate 112, the ground select line GSL has substantially the same voltage increase rate as the substrate 112. When the voltage of the substrate 112 reaches the erase voltage $V_{ers}$, the ground select line GSL may be maintained at the GSL floating voltage $V_{g,f}$ of FIG. 5. In the embodiment of FIG. 8, since the voltage increase rate of the ground select line GSL is higher than the voltage increase rate of the substrate 112 in the second period $t_2$, the voltage difference between the ground select line GSL and the substrate 112 may decrease with time in the second period $t_2$. Accordingly, in the third period $t_3$ of the embodiment of FIG. 8, the GSL saturation voltage $V_{g,s2}$ may be higher than the GSL floating voltage $V_{g,f}$ of FIG. 5. In other words, the difference between the GSL saturation voltage $V_{g,s2}$ and the erase voltage $V_{ers}$ may be smaller than the soft erase voltage $V_{se}$ of FIG. 5. Accordingly, the soft erase of the ground select transistor GST may be prevented.

In a fourth period $t_4$, the voltages of the substrate 112 and the ground select line GSL are reset.

In the erase method of FIG. 8, the periods $t_1$ and $t_2$ may be a substrate voltage increase period for increasing the voltage of the substrate 112 to the erase voltage $V_{ers}$; the period $t_3$ may be a substrate voltage maintenance period for maintaining the erase voltage $V_{ers}$ for a predetermined time and the period $t_4$ may be a reset period for decreasing the voltage of the substrate 112. In addition, the period $t_1$ may be a first delay period for maintaining the ground state of the ground select line GSL; the period $t_2$ may be a GSL voltage increase period for increasing the GSL voltage to the GSL saturation voltage $V_{g,s2}$; the period $t_3$ may be a GSL voltage maintenance period for maintaining the GSL saturation voltage $V_{g,s2}$ for a predetermined time; and the period $t_4$ may be a reset period for decreasing the voltage of the ground select line GSL. In other words, the GSL voltage generator 128 may cause the GSL voltage maintenance period to be reached when the substrate bias circuit 160 of FIG. 1 causes the substrate voltage maintenance period to be reached. In addition, a voltage increase rate of the ground select line GSL in the GSL voltage increase period may be greater than a voltage increase rate of the substrate 112 in the substrate voltage increase period.

According to the erase method of FIG. 8, since the delay period of the ground select line GSL is sufficiently maintained, the memory cells MC1 to MC6 may be normally erased. In addition, since the difference between the GSL saturation voltage $V_{g,s2}$ and the erase voltage $V_{ers}$ is smaller than the soft erase voltage $V_{se}$, the soft erase of the ground select transistor GST may be prevented.

Figure 9:
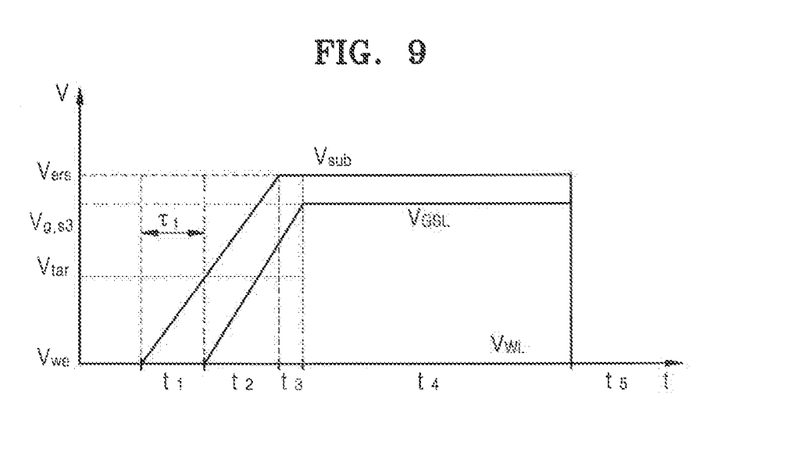
FIG. 9 is a timing diagram illustrating an erase method of a nonvolatile memory device according to an exemplary embodiment of the inventive concept.

FIG. 9 is a timing diagram illustrating an erase method according to an exemplary embodiment of the inventive concept. Except for the voltage increase rate of the ground select line GSL of FIG. 2, the erase method of FIG. 9 is similar to the erase method of FIG. 7, and thus a difference therebetween will be mainly described.

Referring to FIG. 9, the voltage increase rate of the ground select line GSL may be higher than the voltage increase rate of the substrate 112. In addition, the voltage of the ground select line GSL may increase after the voltage of the substrate 112 reaches the erase voltage $V_{ers}$, in other words, in the third period $t_3$. Accordingly, the difference between a GSL saturation voltage $V_{g,s3}$ and the erase voltage $V_{ers}$ may be smaller than the soft erase voltage $V_{se}$ of FIG. 5. Accordingly, the soil, erase of the ground select transistor GST may be prevented.

In the erase method of FIG. 9, the periods $t_1$ and $t_2$ may be a substrate voltage increase period for increasing the voltage of the substrate 112 to the erase voltage $V_{ers}$; the periods $t_3$ and $t_4$ may be a substrate voltage maintenance period for maintaining the erase voltage $V_{ers}$ for a predetermined time; and the period $t_5$ may be a reset period for decreasing the voltage of the substrate 112. In addition, the period $t_1$ may be a first delay period for maintaining the ground state of the ground select line GSL; the periods $t_2$ and $t_3$ may be a GSL voltage increase period for increasing the GSL voltage to the GSL saturation voltage $V_{g,s3}$; the period $t_4$ may be a GSL voltage maintenance period for maintaining the GSL saturation voltage $V_{g,s3}$ for a predetermined time and the period $t_5$ may be a reset period for decreasing the voltage of the ground select line GSL. In addition, a voltage increase rate in the GSL voltage increase period may be higher than a voltage increase rate of the substrate voltage increase period. The GSL voltage generator 128 may cause the GSL voltage maintenance period to be reached after the substrate bias circuit 160 causes the substrate voltage maintenance period to be reached.

According to the erase method of FIG. 9, since the delay period of the ground select line GSL is sufficiently maintained, the memory cells MC1 to MC6 may be normally erased. In addition, since the difference between the GSL saturation voltage $V_{g,s3}$ and the erase voltage $V_{ers}$ is smaller than the soft erase voltage $V_{se}$, the soft erase of the ground select transistor GST may be prevented.

Figure 10:
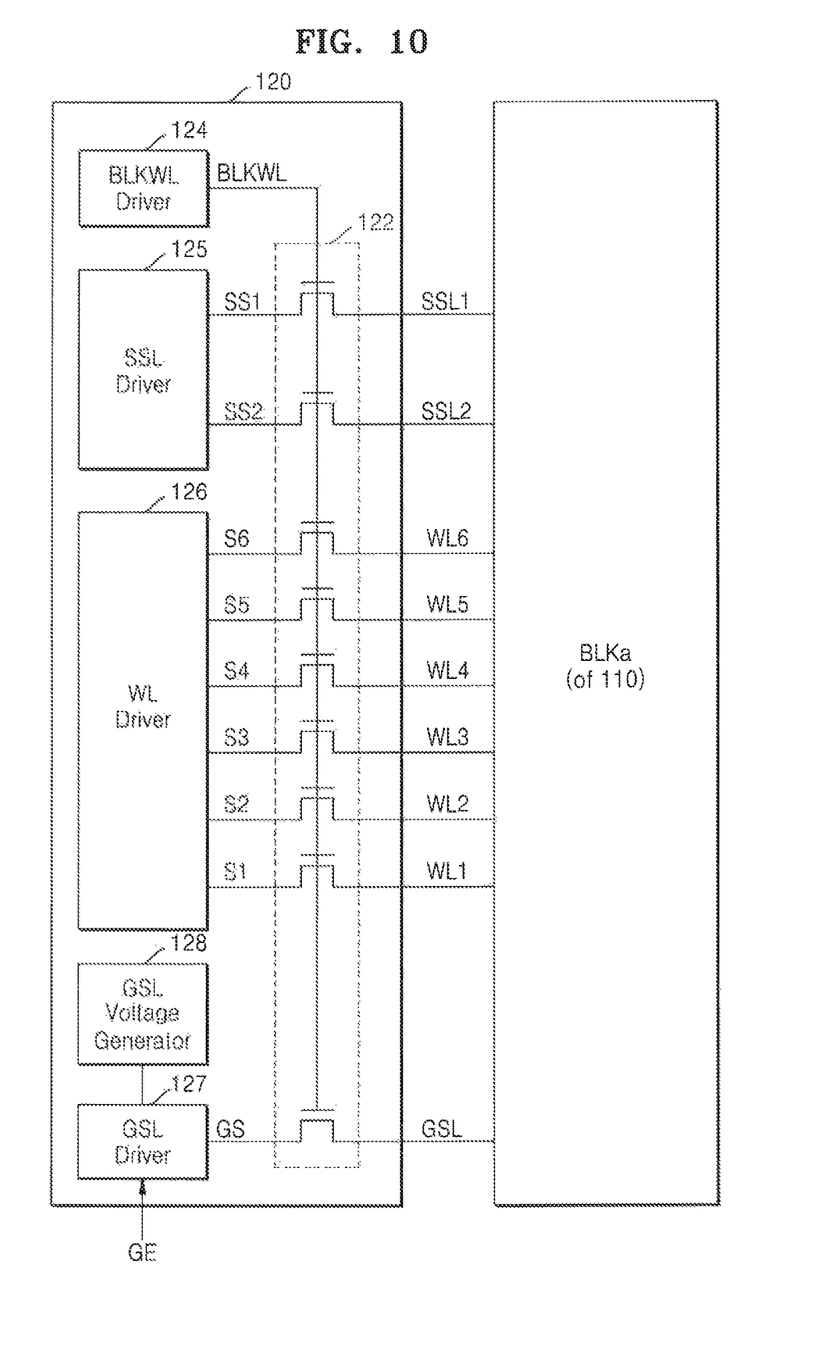
FIG. 10 is a block diagram illustrating a memory cell array and an address decoder of a nonvolatile memory device according to an exemplary embodiment of the inventive concept.

FIG. 10 is a block diagram illustrating a memory cell array 110 and an address decoder 120 of a nonvolatile memory device 100 according to an exemplary embodiment of the inventive concept. As an example, only one memory block BLKa of the memory cell array 110 is illustrated in FIG. 10.

Referring to FIG. 10, the address decoder 120 may include a block selection circuit 122, a block word line (BLKWL) driver 124, a string select line (SSL) driver 125, a word line (WL) driver 126, and a ground select line (GSL) driver 127.

In addition, the address decoder 120 may further include a ground select line (GSL) voltage generator 128 connected to the GSL driver 127. The GSL voltage generator 128 may be included in the GSL driver 127.

The block selection circuit 122 is configured to select one of the memory blocks of the memory cell array 110. The block selection circuit 122 may include a plurality of switches, for example, a plurality of transistors.

Gates of the transistors of the block selection circuit 122 are connected in common to a block word line BLKWL. Some of the transistors of the block selection circuit 122 are connected between string select lines SSL1 and SSL2 and select lines SS1 and SS2, respectively. Some of the transistors of the block selection circuit 122 are connected between word lines WL1 to WL6 and select lines S1 to S6, respectively. Some of the transistors of the block selection circuit 122 are connected between a ground select line GSL and a select line GS. In other words, in response to a voltage level of the block word line BLKWL, the block selection circuit 122 connects the string select lines SSL1 and SSL2, the word lines WL1 to WL6, and the ground select line GSL to the SSL driver 125, the WL driver 126, and GSL driver 127, respectively.

The BLKWL driver 124 is configured to drive the block word line BLKWL. For example, when the memory block BLKa is selected, the BLKWL driver 124 may apply a select voltage to the block word line BLKWL. For example, the BLKWL driver 124 may apply a high voltage Vpp to the block word line BLKWL in a program/read operation, and may apply a power voltage Vcc to the block word line BLKWL in an erase operation.

The SSL driver 125 is connected to the select lines SS1 and SS2. The select lines SS1 and SS2 are connected through the block selection circuit 122 to the string select lines SSL1 and SSL2. In other words, the SSL driver 125 is configured to drive the string select lines SSL1 and SSL2 through the block selection circuit 122. For example, the SSL driver 125 is configured to float the string select lines SSL1 and SSL2 in an erase operation.

The WL driver 126 is connected to the select lines S1 to S6. The select lines S1 to S6 are connected through the block selection circuit 122 to the word lines WL1 to WL6. In other words, the WL driver 126 is configured to drive the word lines WL1 to WL6 through the block selection circuit 122. As an example, the WL driver 126 is configured to apply a word line erase voltage $V_{we}$ to the word lines WL1 to WL6 in an erase operation.

The GSL driver 127 is connected to the select lines GS. The select lines GS are connected through the block selection circuit 122 to the ground select lines GSL. In other words, the GSL driver 127 is configured to drive the ground select lines GSL through the block selection circuit 122.

The GSL driver 127 is configured to operate in response to a ground enable signal GE in an erase operation. As an example, the GSL driver 127 is configured to apply a first preset voltage (for example, a ground voltage Vss) to the ground select lines GSL when an erase operation starts. The first preset voltage may be applied to turn on ground select transistors GST connected to the ground select lines GSL. When a logic value of the ground enable signal. GE changes, the GSL driver 127 may turn on the GSL voltage generator 128.

For example, when the ground enable signal GE changes, the GSL driver 127 may transmit a signal to turn on the GSL voltage generator 128 and output a GSL voltage from the GSL voltage generator 128. The GSL voltage may be provided to have a sequence according to the erase methods described with reference to FIGS. 7 to 9. For example, when the ground enable signal GE changes, the GSL voltage generator 128 may be turned on to bias the ground select line GSL of the memory cell array 110 and apply GSL saturation voltages $V_{g,s1}$ to $V_{g,s3}$ to the ground select line GSL of the memory cell array 110 according to a predetermined sequence.

As described above, the nonvolatile memory device 100 according to the exemplary embodiments of the inventive concept is configured to drive the ground select lines GSL in response to a substrate voltage change of the memory cell array 110 in an erase operation. Accordingly, the memory cells MC1 to MC6 may be normally erased, and the soft erase of the ground select transistors GST may be prevented. Therefore, the reliability of the nonvolatile memory device 100 may be improved.

Figure 11:
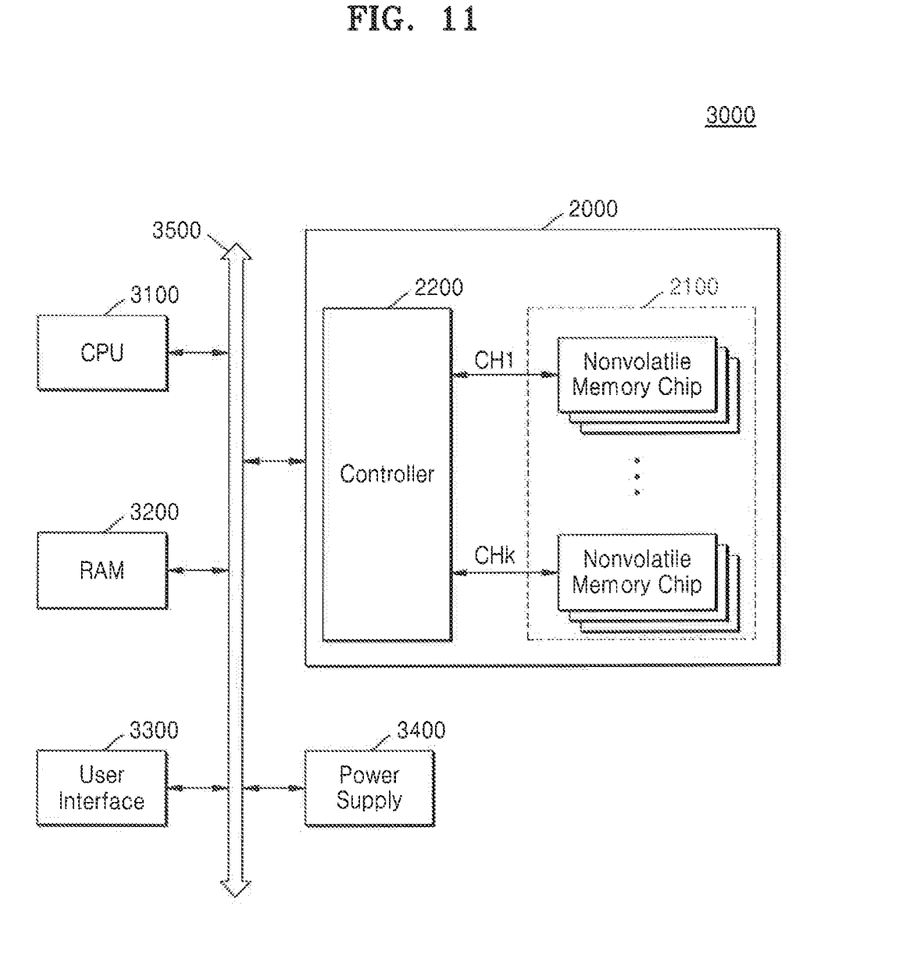
FIG. 11 is a block diagram illustrating a computing system including the nonvolatile memory device of FIG. 1, according to an exemplary embodiment of the inventive concept.

FIG. 11 is a block diagram illustrating a computing system 3000 including the nonvolatile memory device 100 of FIG. 1, according to an exemplary embodiment of the inventive concept. Referring to FIG. 11, the computing system 3000 includes a central processing unit (CPU) 3100, a random access memory (RAM) 3200, a user interface 3300, a power supply 3400, and a memory system 2000.

The memory system 2000 may include the nonvolatile memory device 100 of FIG. 1. The memory system 2000 includes a nonvolatile memory device 2100 and a controller 2200. The nonvolatile memory device 2100 may be the nonvolatile memory device 100 described with reference to FIGS. 1 to 4 and may be configured to operate according to the erase methods described with reference to FIGS. 6 to 9. The controller 2200 is connected to a host and the nonvolatile memory device 2100. The controller 2200 is configured to access the nonvolatile memory device 2100 in response to a request from the host. For example, the controller 2200 is configured to control read, write, erase and background operations of the nonvolatile memory device 2100. The controller 2200 is configured to provide an interface between the nonvolatile memory device 2100 and the host.

The memory system 2000 is electrically connected through a system bus 3500 to the CPU 3100, the RAM 3200, the user interface 3300, and the power supply 3400. Data, which is provided through the user interface 3300 or processed by the CPU 3100, is stored in the memory system 2000.

The nonvolatile memory device 2100 may be connected through the controller 2200 to the system bus 3500, or may be connected directly to the system bus 3500. In this case, read and erase operations of the nonvolatile memory device 2100 may be controlled by the CPU 3100. In addition, a refresh operation of the nonvolatile memory device 2100 may be controlled by the CPU 3100.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. An erase method of a nonvolatile memory device, comprising:

applying a ground voltage to a ground select line connected to at least one ground select transistor of a cell string including a plurality of cell transistors;

applying a word line erase voltage to word lines connected to the plurality of cell transistors;

applying an erase voltage to a substrate on which the cell string is disposed; and applying a ground select line saturation voltage to the ground select line, wherein the ground select line saturation voltage is applied to the ground select line after a first delay time ends after the erase voltage is applied to the substrate, wherein the ground select line saturation voltage has an increase period that overlaps with a substrate voltage maintenance period, wherein a voltage of the ground select line is increased in the increase period of the ground select line saturation voltage, and a voltage of the substrate is maintained at the erase voltage in the substrate voltage maintenance period.

2. The erase method of claim 1, wherein the first delay time ends after a voltage of the substrate reaches a target voltage lower than the erase voltage.

3. The erase method of claim 1, wherein a voltage increase slope of the ground select line saturation voltage is higher than a voltage increase slope of a voltage of the substrate.

4. The erase method of claim 1, wherein a voltage increase slope of the ground select line saturation voltage is substantially equal to a voltage increase slope of a voltage of the substrate and the voltage increase slope of the ground select line saturation voltage is maintained for a predetermined period after the voltage of the substrate reaches the erase voltage.

5. The erase method of claim 1, wherein the at least one ground select transistor is not soft-erased by application of the ground select line saturation voltage.

6. The erase method of claim 1, wherein a soft erase voltage is a difference between the erase voltage and a voltage reached by the ground select line when the ground select line is floated after the first delay time ends after the erase voltage is applied to the substrate, and a difference between the ground select line saturation voltage and the erase voltage is smaller than the soft erase voltage.

7. The erase method of claim 1, wherein the ground select line saturation voltage is higher than a ground select line floating voltage.

* * * * *